United States Patent [19]

Seroussi

[11] Patent Number: 4,835,775
[45] Date of Patent: May 30, 1989

[54] HYPERSYSTOLIC REED-SOLOMON ENCODER

[75] Inventor: Gadiel Seroussi, Oakland, Calif.

[73] Assignee: Cyclotomics, Inc., Berkeley, Calif.

[21] Appl. No.: 107,207

[22] Filed: Oct. 13, 1987

[51] Int. Cl.[4] .................................................. G06F 11/10
[52] U.S. Cl. ...................................................... 371/37
[58] Field of Search ........................ 371/37, 38, 39, 40

[56] References Cited

U.S. PATENT DOCUMENTS

| 4,584,686 | 4/1986 | Fritze | 371/37 |
| 4,665,523 | 5/1987 | Citron | 371/37 |
| 4,747,103 | 5/1988 | Iwamura | 371/37 |

*Primary Examiner*—Jerry Smith
*Assistant Examiner*—Robert W. Beausoliel
*Attorney, Agent, or Firm*—Robert M. Wallace

[57] ABSTRACT

A systematic systolic array of R Cauchy cells receives a message stream of K symbols, systolically computes R check symbols therefrom and appends them to the end of the meassage stream to form a codeword of $N=K+R$ symbols. The Cauchy cells operate independently, there being no feedback as is usually required, so that only adjacent cells need operate synchronously, a clock signal being systolically passed from cell to cell and the systolic array as a whole being asynchronous. As a result, the encoder may operate at much higher data rates and is easily reconfigurable in real time to adjust for any changes in the number of message symbols (K) or the number of check symbols (R).

16 Claims, 9 Drawing Sheets

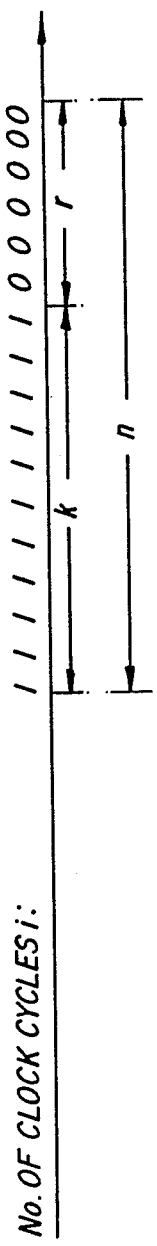
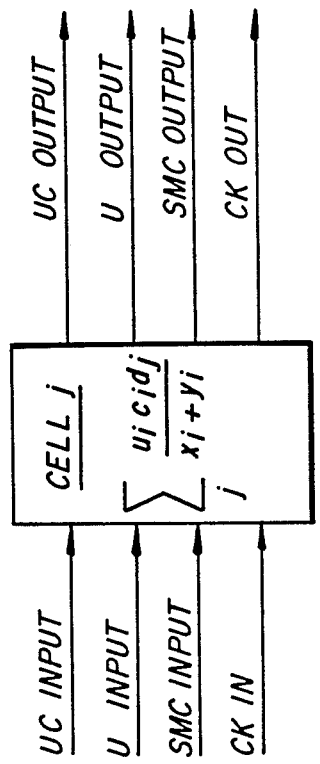

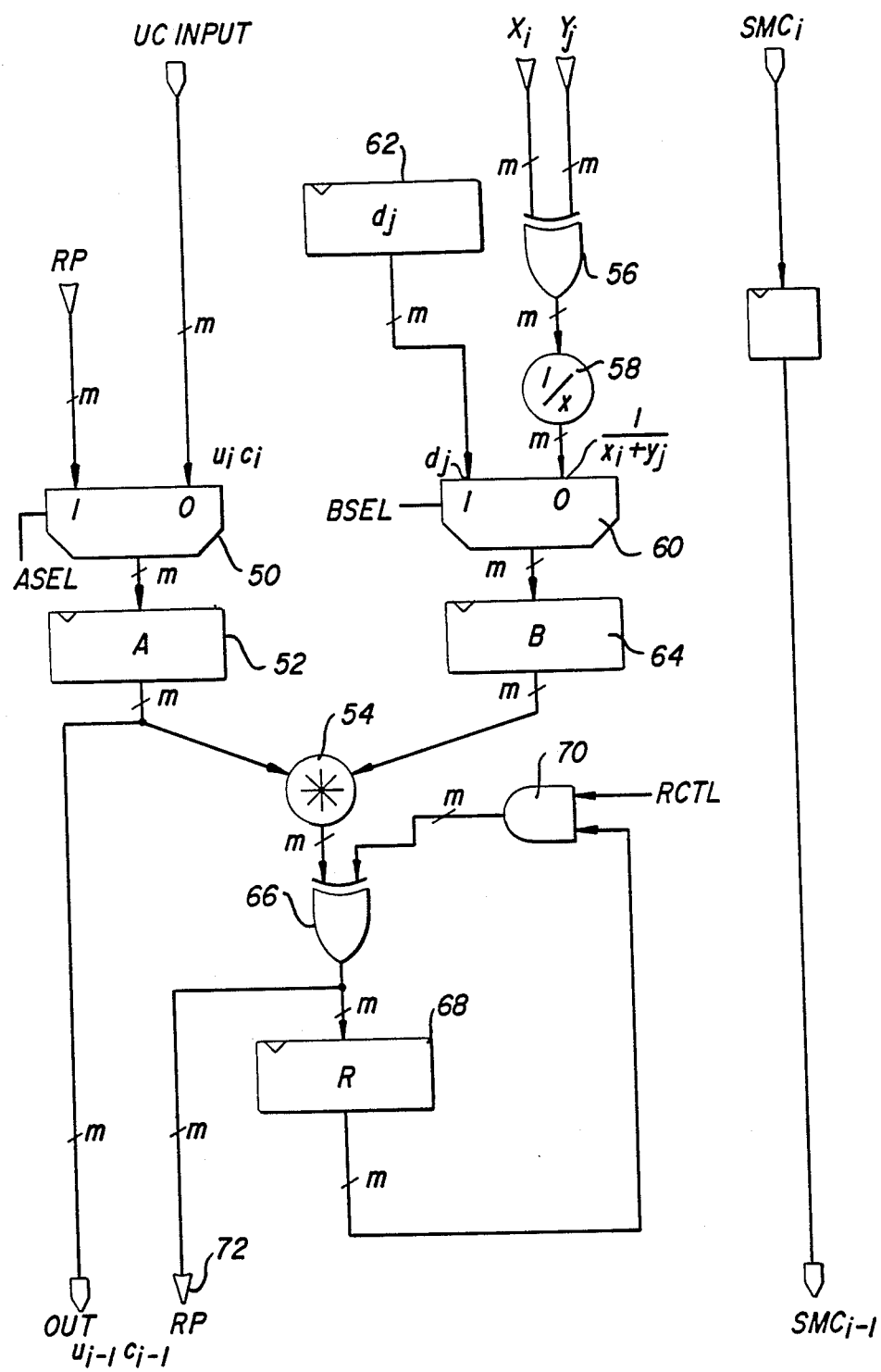

FIG.7(a) SMC (CELL j-1)
FIG.7(b) SMC (CELL j)
FIG.7(c) ASEL=BSEL
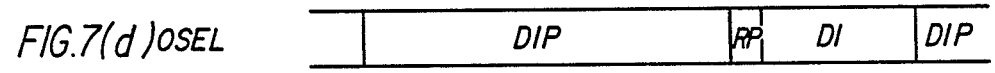
FIG.7(d) OSEL
FIG.7(e) XSEL
FIG.7(f) RCTL
FIG.7(g) CSEL
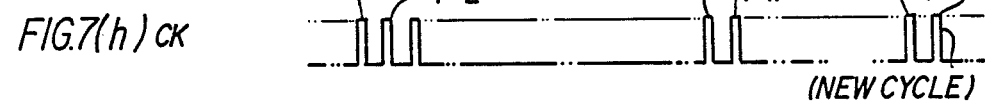
FIG.7(h) CK
(NEW CYCLE)

HYPERSYSTOLIC REED-SOLOMON ENCODER

BACKGROUND OF THE INVENTION

Error detection and correction systems remove errors introduced into data traveling through a channel from a transmitter to a receiver. In such a system, the transmitter appends to each set of message symbols a set of redundant check symbols in accordance with a code generator polynominal G(Z) known to both the transmitter and the receiver. The codeword thus generated contains sufficient information for the receiver to correct errors introduced during transit through the channel, as long as the number of erroneous symbols does not exceed half the number of check characters, using Reed-Solomon codes, for example. Such error detection and correction systems are useful over a wide variety of digital systems including digital recording systems, digital memory systems and digital communications systems.

One type of error detection and correction system uses Reed-Solomon codes to construct the redundant check characters (encode) at the transmitter and to correct errors (decode) at the receiver. The transmitter computes the redundant check symbols from the set of message characters using a standard Reed-Solomon encoder.

Problem to be Solved Referring to FIG. 1, a standard Reed-Solomon encoder includes an input node 10 which receives the stream of message symbols in serial succession, and an output node 12 from which the redundant check characters are transmitted following the end of the stream of message symbols. Between the input and output nodes 10, 12 lies a shift register wired in accordance with the code generator polynominal G(Z), the shift register comprising a plurality of stages 14, Galois field adders 16 and Galois field multipliers 18. Each of the Galois field multipliers 18 multiplies the feedback signal by a particular one of the coefficients $g_i$ of the code generator polynominal G(Z), as illustrated in FIG. 1. In the Reed-Solomon encoder of FIG. 1, the number of stages in the shift register is precisely equal to R, the number of redundant check characters.

The problem with the standard Reed-Solomon encoder of FIG. 1 is twofold, namely: (a) Timing constraints: The feedback network requires all of the stages 14 to operate synchronously. This in turn requires a central (global) clock, which must be distributed to all of the stages. Such distribution entails long connections or a complex distribution scheme, either of which slows down the system, due to inevitable clock skews created by the distribution network. And (b) Inflexibility: a significant hardware change is required whenever it is desired to change the number R of redundant check characters to be appended to the block of K message symbols.

The problem is how to implement a more flexible Reed-Solomon encoder which is systematic (i.e., it reproduces the stream of message symbols immediately followed by a stream of redundant check symbols), which does not have global signals, and which is faster than currently available encoders.

Proposed Attack on the Problem by Others

One known way of attacking the problem is so-called "transform" encoding and decoding which has the advantage of not requiring any feedback among each of the cells of the shift register. The transform encoder lends itself to a systolic implementation, i.e., an implementation without feedback or global signals in which each cell is connected only to its immediate neighbors. Each symbol in a codeword generated by such a transform encoder is a linear combination of all symbols in the original message. The disadvantages of such transform encoding are: (a) the number of encoder cells (shift register stages) is equal to K, the number of message symbols in each block (which usually is far greater than the number R of cells required in FIG. 1) and (b) the encoding is non-systematic, in that the message and redundancy information is distributed among the K+R codeword symbols generated by the transform encoder, so that the encoder does not output an exact copy of the original message (which complicates the decoding process). Thus, because the transform encoder requires K-R more cells than the standard Reed-Solomon encoder and because it is non-systematic, it is not really a solution to the problem.

SUMMARY OF THE INVENTION

The present invention is a highly flexible systolic systematic Reed-Solomon encoder having R stages which operate independently of each other (so that the encoder is systolic) and receive and pass on (without alteration) each of the message symbols before appending a redundant check symbol at the end of the message stream (so that the encoder is systematic). The encoder comprises a set of identical modular cells quickly reconfigurable to adjust for changes in the number R of check symbols to be appended to a given block of message symbols (so that the encoder is flexible).

Solution to the Problem

It is a discovery of the invention that there is an algorithm which can be performed at each stage of an R-stage encoder without reference to any of the computations performed in the other stages, to generate an individual one of the R redundant check symbols. There is no feedback between any of the individual cells using such an algorithm, and the operation is systolic and systematic. The algorithm is adapted in each individual one of the R stages by selecting the values of two constants in the algorithm, as will be described. Otherwise, each of the cells defining the stages in the encoder shift register are identical in their hardware configuration and operation, facilitating a significant cost savings. Because each cell is independent from each of the other cells, the systolic array of cells is readily adaptable to changes in the number R of check symbols to be appended to the block of message characters.

Systolic Architecture

The $j^{th}$ cell of the R systolic encoder cells performs the following operation on each of the K message symbols $u_i$ to compute the $j^{th}$ redundant check symbol $w_j$:

$$w_j = \sum_{i=1}^{K} \frac{u_i c_i d_j}{x_i + y_j}, \qquad (1)$$

where j obeys the following:

$$1 \leq j \leq R.$$

Each of the quantities $c_i$ and $x_i$ are defined below in this specification; they change each time a different message symbol $u_i$ is received in the cell. The quantities $d_j$ and $y_j$ are quantities which are constant within the $j^{th}$ cell and are also defined below in the specification. Such a cell is called a Cauchy cell, in accordance with the class of mathematical operations it performs which are described in Seroussi and Roth, "On Generator Matrices of MDS Codes," *IEEE Transactions on Information Theory*, November 1985, pp. 826-830.

In operation, the cells are arranged in serial order and process each succeeding message symbol $u_j$ in order of receipt, passing the current message symbol to its neighboring downstream cell while receiving the next message symbol from its neighboring upstream cell. As the last message symbol $u_k$ leaves the $j^{th}$ cell and enters the $j+1^{st}$ cell, the $j^{th}$ cell completes the computation of the redundant message symbol $w_j$ and appends $w_j$ to the end of the message stream. In this manner, a complete set of R redundant check symbols ($w_1$ through $w_R$) are appended at the end of the message stream of K message symbols as the array of R cells systolically processes the message symbol block.

Each cell may be enabled or disabled in real time so that it either appends or does not append its computed redundant check symbol to the message stream. In this manner, the number R of active cells (which determines the number R of appended redundant check symbols) may be increased or decreased in real time in accordance with any desired change in R. Furthermore, the operation of the systolic array of Cauchy cells of the invention is independent of the number K of message symbols, so that the systolic array of Cauchy cells of this invention can accommodate in real time changes in K, the number of message symbols and/or R, the number of redundant check symbols in each code word.

Globally Asynchronous Operation

When the encoder has a global signal (e.g. the feedback path), that signal needs to be generated at one cell and synchronously clocked to a plurality of other cells. This forces a synchronous design with a global clock.

Elimination of the feedback path (and any other global signals) permits a systolic clock distribution method, by which each cell receives an input clock signal (say CK_IN) from its predecessor cell, electrically buffers it, and propagates it through an output clock signal (say CK_OUT) to its successor cell. The fact that the clock is also systolic is denoted by the "hyper" prefix (hence, the term "hypersystolic encoder"). Systolic arrays found in the literature have a central (global) clock, which needs to be distributed to all the cells through some kind of distribution net. As mentioned above, this implies the need for either long connections or a complex distribution scheme, which in any case slow down the system, due to the inevitable clock skews created by the distribution net. In a hypersystolic system, clock distribution is ideal: a very short clock line from one cell to the next.

Also, in the hypersystolic system of the invention, while neighboring cells may be regarded as synchronous (they exchange data through a common clock that is transmitted from one to the next), the system as a whole is asynchronous, due to the clock skew caused by the passage of the clock signal through each cell. When one looks at two cells that are not immediate neighbors (say, three or four cells apart), the accumulated clock skew is large enough so that they may be considered asynchronous (i.e. the clock signals are in random phase with respect to each other).

The hypersystolic encoder may therefore operate at extremely high data rates, on the order of several gigabits/second, which are extremely difficult if not impossible to attain with standard designs.

DESCRIPTION OF THE DRAWINGS

The invention may be understood by reference to the accompanying drawings, of which:

FIG. 3 is a simplified block diagram of an individual cell in the encoder of FIG. 2;

FIGS. 4a-4e include contemporaneous timing diagrams illustrating operation of the hypersystolic Reed-Solomon encoder of FIG. 2;

FIGS. 6a, 6b and 6c are detailed block diagrams of the cell of FIG. 3; and

FIGS. 7a-7h include contemporaneous timing diagrams of signals controlling operation of the cell of FIG. 3.

DETAILED DESCRIPTION

Overview of the Systolic Array

Figure 1:
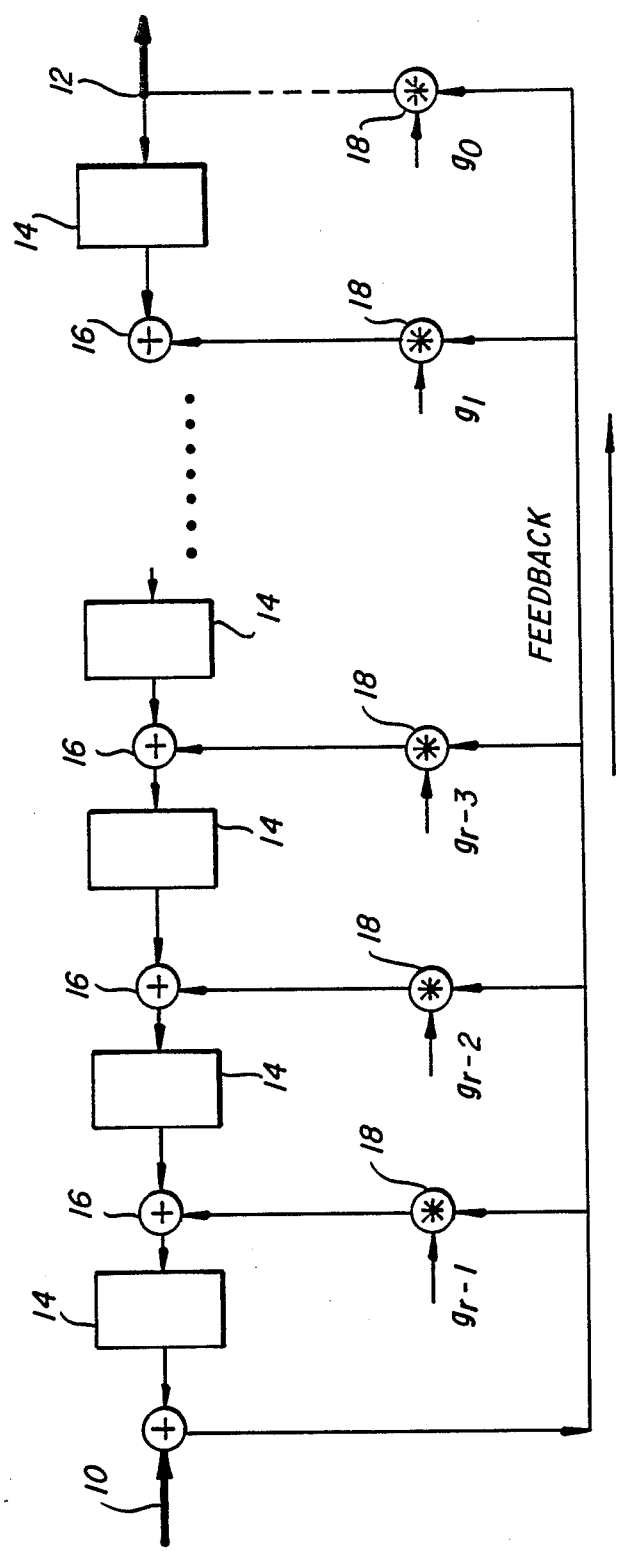
FIG. 1 is a simplified block diagram of a prior art Reed-Solomon encoder.
Figure 2:
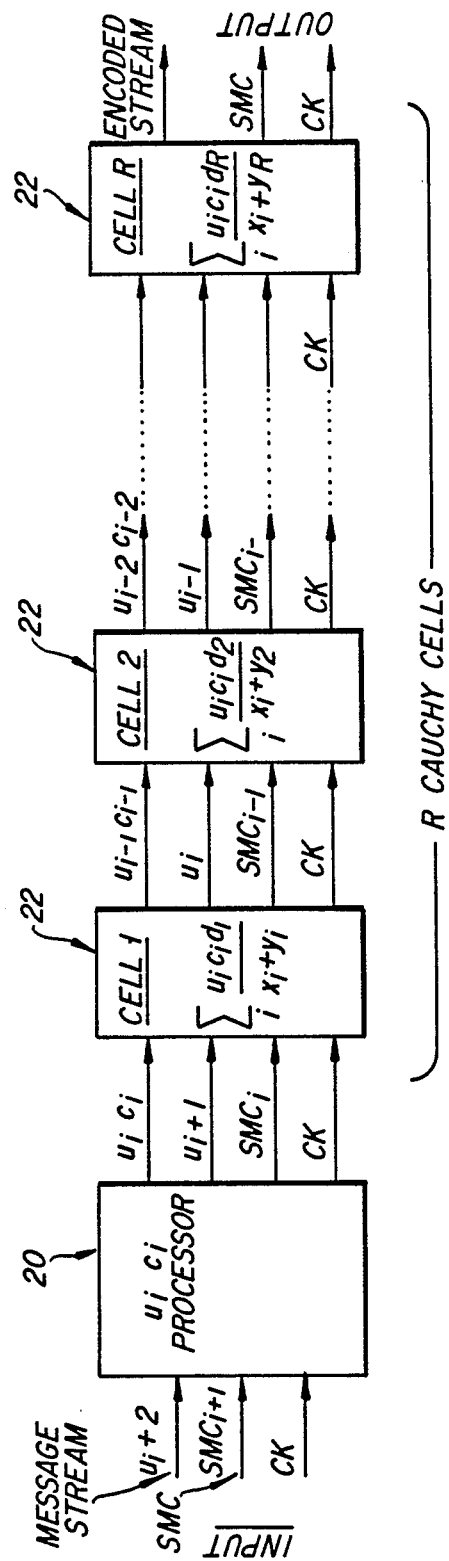
FIG. 2 is a simplified block diagram of the hypersystolic Reed-Solomon encoder of the invention.

Referring to FIG. 2, a $u_i c_i$ processor 20 receives at its input a stream of message symbols $u_i$ in synchronism with a clock signal CK. The processor 20 transmits at its output a delayed version of the stream of message symbols $u_i$ and a buffered version of the clock signal CK. In addition, the processor 20 outputs the product $u_i c_i$ to be defined below. These three results are passed to a systolic array of identical Cauchy cells 22. This array processes the stream of message symbols $u_i$ and products $u_i c_i$ systolically in synchronism with the hypersystolic clock signal CK and adds a stream of check characters at the end of the message stream. Each of the cells has the form illustrated in FIG. 3, including a UC input, a U input, an SMC input, a CK_IN input, a UC output, a U output, an SMC output and a CK_OUT output. The $j^{th}$ one of the R cells, for example, performs the algorithm indicated in FIG. 3 using all of the message symbols $u_i$ through $u_K$ and constants $d_j$ and $y_j$ to be defined below.

As soon as the last ($K^{th}$) message symbol $u_K$ has been received and processed in the $j^{th}$ cell, the computation performed by that cell of the $j^{th}$ redundant check symbol $w_j$ is complete, so that the $j^{th}$ cell outputs $w_j$ on its U output immediately following the last symbol in the message stream. The next symbol, of course, will be the check symbol $w_{j-1}$ appended by the adjacent upstream neighbor cell (the $j-1^{st}$ cell).

This is best illustrated in FIG. 4. In FIG. 4a, the SMC input of cell number 1 constitutes a string of K logic "ones" (during the first K cycles of the clock signal CK) followed by a string of R logic "zeroes" (during the last R cycles of the clock signal CK). Thus, $SMC_i = 1$ for $i = 1$ through K, and $SMC_i = 0$ for $i = K+1$ through $K+R$. The SMC signal serves to inform the cell when the transition from message to check symbols occurs.

Simultaneously, the U input of cell 1 (FIG. 4b) constitutes the K message symbols $u_1$ through $u_K$ for the first K cycles of the clock signal CK followed by R zeroes for the last R cycles of the clock signal CK. The U output of cell number 1 (FIG. 4c) is delayed with respect to the U input by one CK clock cycle and comprises the K message symbols $u_1$ through $u_K$ in order followed by the results of the computation performed in cell number 1, namely the redundant check character $w_1$. This is followed in turn by R-1 zeroes.

The next cell, cell number 2 (whose output is not illustrated in FIG. 4) has an identical output, delayed with respect to the output of cell 1 by one CK clock cycle, except that $w_2$ (computed in cell number 2) is inserted immediately before $w_1$.

Finally, as illustrated in FIG. 4d, the U output of cell R, the last cell in the systolic array of cells 22, is delayed with respect to the output of cell 1 by R clock cycles, and is in fact identical therewith for the first K clock cycles, but thereafter transmits all of the check characters $w_1$ through $w_R$ at the end of the message stream ($w_R$ being computed in cell R). The SMC output of cell R is identical with the SMC input of cell 1 except that it is delayed by R clock cycles.

Each of the Cauchy cells 22 must process all of the message symbols in the stream before it can generate a corresponding redundant check symbol to be added to the end of the stream.

In principle, FIG. 4 may be thought of as illustrating a process in which a long train (stream) of railroad cars (message symbols) is constantly supplemented "on the fly" with an additional railroad car (check symbol) as it passes through periodic stations (cells) along the railroad track, each station being responsible for inserting its own particular railroad car, until the last station adds the last additional railroad car to the train, and the process is complete.

Definition of the Systolic Algorithm

Referring to the algorithm of equation (1) on page 4, $u_i$ is the $i^{th}$ message symbol in the stream of K message symbols. $u_i$ is an m-bit binary byte and the encoder of FIG. 2 uses a Reed-Solomon code of maximum length $N=2^m-1$ in a Galois field $GF(2^m)$ to compute the R redundant check symbols in accordance with a code generator polynominal G(Z). In the following definitions, $\alpha$ is a primitive element of the Galois field $GF(2^m)$. (See Elwyn R. Berlekamp, *Algebraic Coding Theory*, Academic Press, 1968.) The remaining symbols in the algorithm of equation (1) are defined as follows:

$$x_i = \alpha^{-i}, \text{ where } 1 \leq i \leq K, \quad (2)$$

$$y_j = \alpha^{-(K+j)}, \text{ where } 1 \leq j \leq R, \quad (3)$$

$$c_i = \frac{\alpha^{ia}}{\pi_{1 \leq t \leq K, t \neq i}(\alpha^{-i} + \alpha^t)}, \text{ where } 1 \leq i \leq K, \quad (4)$$

$$d_j = \alpha^{-(j+K)a} \pi_{1 \leq t \leq K}(\alpha^{-(j+K)} + \alpha^{-t}), \quad (5)$$

where $$1 \leq j \leq R$$

In equations (1)–(5), K is the number of message bytes and the parameter a is defined as follows:

$$(6) \quad a = (1-L)$$

mod N, (i.e., a is the positive remainder from $(1-L) \div N$) where $\alpha^L$ is the lowest order root of the code generator polynominal G(Z). (The quantity L is discussed in somewhat greater detail in U.S. patent application Ser. No. 076,579 entitled "Hard-Wired Serial Galois Field Decoder" filed July 22, 1987 by Earl T. Cohen).

Referring to FIG. 2, each cell receives the product $u_i c_i$ generated at the processor 20, so that the cell is responsible for performing only a part of the computation of equation (1). There are R Cauchy cells which process the stream of products $u_i c_i$ and there is an additional cell of different design used to implement the $u_i c_i$ processor 20, for a total of R+1 cells.

$u_i c_i$ Processor 20

Figure 5A:
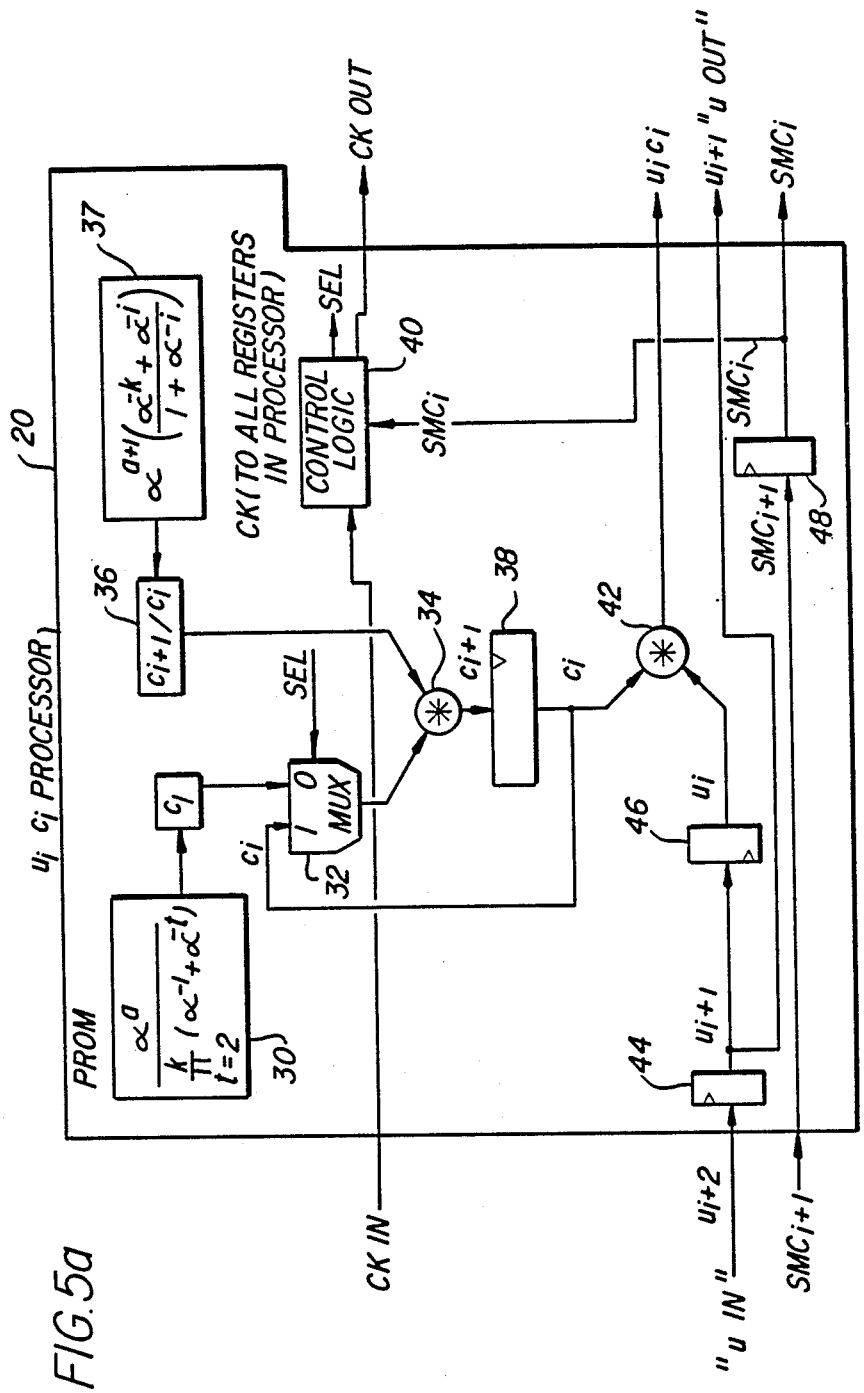
FIGS. 5a and 5b illustrate the $u_i c_i$ processor used in the hypersystolic encoder of FIG. 2.

An implementation of the $u_i c_i$ processor 20 is illustrated in FIG. 5a. The processor 20 includes a register 30 containing an m-bit byte equal to the first of the $c_1$'s, namely $c_1$ (a constant). The definition of $c_1$ is denoted in FIG. 5a inside the register 30. This byte ($c_1$) is furnished to the "0" input of a multiplexer 32. The value of $c_1$ is loaded into the register 30 during system initialization and remains constant during operation.

The output of the multiplexer 32 is applied to one input of a Galois field multiplier 34. The other input of the Galois field multiplier 34 receives an m-bit byte equal to the ratio $c_{i+1}/c_i$, by which each $c_{i+1}$ may be computed from its predecessor, $c_i$. This ratio is stored in register 36 and is defined (as denoted in FIG. 5a inside the box 37) for each value of i in accordance with the following equation:

$$(7) \quad c_{i+1}/c_i = (\alpha^{a+1-K} + \alpha^{a+1-i})/(1+\alpha^{-1})$$

where the range of i is:

$$1 \leq i \leq K-1$$

and the quantity "a" is as defined previously. The output of the multiplier 34 is applied to the input of a register 38 whose output is applied to the "1" input of the multiplexer 32.

The register 38 stores the output, $c_{i+1}$, of the multiplier 34. $c_{i+1}$ is present at the input of the register 38 while, simultaneously, its predecessor $c_i$ is present at the output of the register 38. The register 36 furnishes to the multiplier 34 the appropriate ratio $c_{i+1}/c_i$ for each value of i. A logic circuit 37 (FIG. 5b) loads a new value of $c_{i+1}/c_i$ into the register 36 each time the index i is incremented.

Figure 5B:
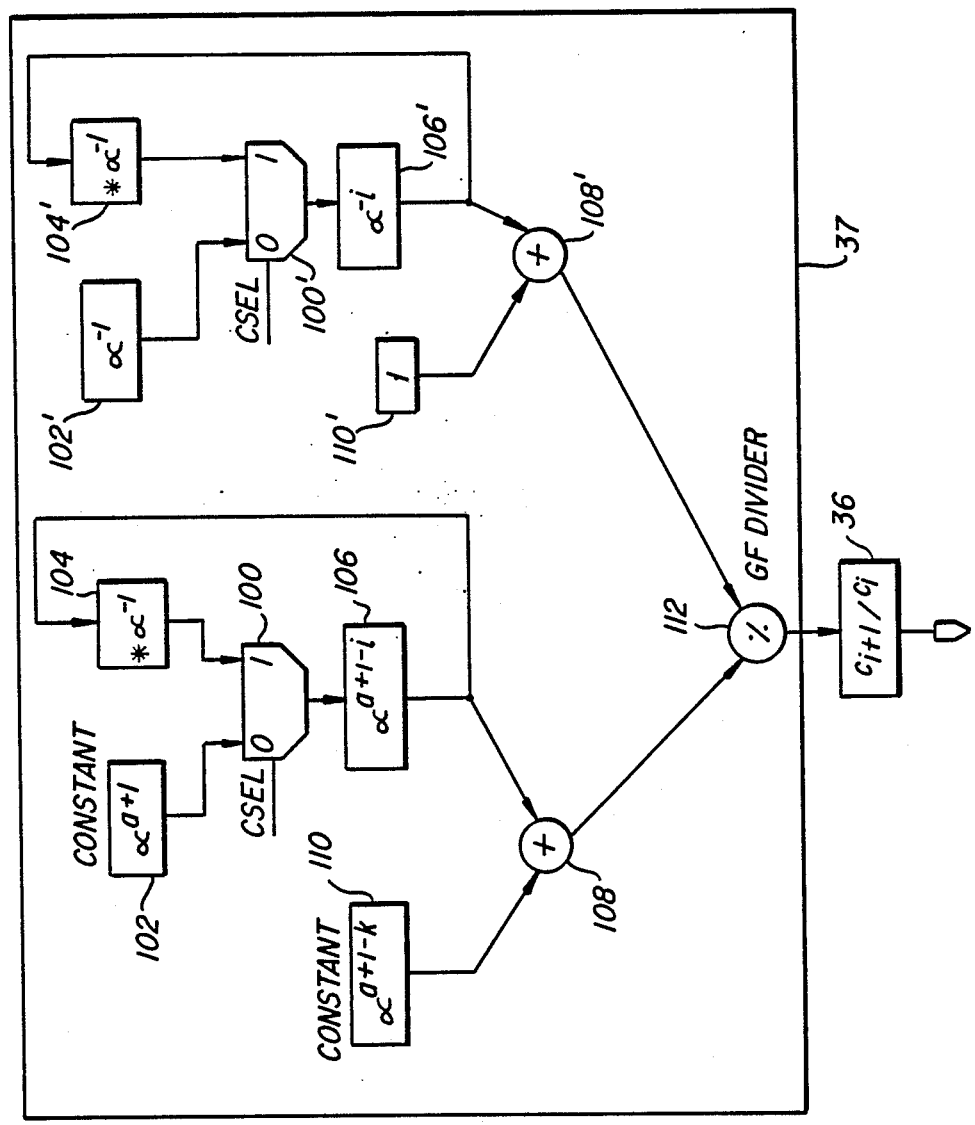

The logic circuit 37 computes the ratio $c_{i+1}/c_i$ in accordance with equation (7) for each successive value of i. FIG. 5b illustrates one way the logic circuit may be implemented. A CSEL logic signal (FIG. 7g) causes a multiplexer 100 to select a constant $\alpha^{a+1}$ furnished to its 0 input from a register 102 just before the receipt of the message stream. (The register 102 is programmed with the value of $\alpha^{a+1}$ during system initialization and remains constant during system operation.) Then, during receipt of the message stream, the CSEL logic signal causes the multiplexer to select at its 1 input the product furnished by a constant multiplier 104. The constant multiplier 104 multiplies whatever value is present at its input by $\alpha^{-1}$ in accordance with Galois field multiplication rules. This type of multiplier is described below in greater detail in connection with FIG. 6b.

The current output of the multiplexer 100 is stored in a register 106, whose contents is recirculated through the input of the constant multiplier 104. The content of the register 106 is the value of $\alpha^{a+1-i}$. A Galois field adder 108 combines this latter quantity with the value of a constant $\alpha^{a+1-K}$ furnished from a register 110. The register 110 is programmed with the value of $\alpha^{a+1-K}$ during system initialization and remains constant during system operation. The output of the adder 108 is the numerator of the expression at the right hand side of equation (7). The denominator of this ratio is computed in a sub-circuit 102', 104', 106', 108', 110' identical to the foregoing sub-circuit 102, 104, 106, 108, 110, except that the register 102' is initialized with the value of $\alpha^{-1}$ and the register 110' is initialized with the value of 1. The Galois field divider 112 divides the numerator from the register 108 by the denominator from the register 108' to generate the ratio $c_{i+1}/c_i$.

Operation is controlled by a control logic circuit 40 in synchronism with the SMC signal and the clock signal CK received at the CK_IN input to the processor 20. The control circuit 40 distributes a version of the clock signal CK to the clock inputs of all the registers in the processor 20. The control logic circuit 40 also transmits the CSEL select signal to the multiplexer 32 telling the multiplexer 32 which one of its two inputs ("0" or "1") to select. The control logic circuit 40 holds the CSEL control signal in the 0 logic state until just before the beginning of the stream of message characters, causing $c_1$ to be sent by the multiplexer 32 to the multiplier 34 at that time. Thereafter, the CSEL logic signal is in a logic 1 state until the end of the message stream, so that the multiplexer 32 applies the current output of the register 38 (i.e., $c_i$) to the multiplier 34. (The CSEL logic signal is illustrated in FIG. 7g as mentioned above.)

The contents of the register 38 (i.e., $c_i$) is multiplied by the message symbol $u_i$ in a Galois field multiplier 42 to generate the product $u_i c_i$ at the UC output of the processor 20. The message symbol $u_i$ is derived from the U input of the processor 20 by interposing two m-bit delay stages 44, 46. The input to the processor 20 is the message symbol $u_{i+2}$, the output of the delay stage 44 is the message $u_{i+1}$ and the output of the delay stage 46 is the message symbol $u_i$. The SMC input is applied to the input of a delay stage 48, whose output furnishes the previous SMC pulse, namely $SMC_i$ to the SMC output of the processor 20.

In summary, the processor 20 successively generates each of the $c_i$'s, starting with $c_1$, by simply multiplying the current $c_i$ by a recursion formula to generate the next value, $c_{i+1}$. The processor 20 further multiplies $u_i$ by $c_i$ and provides this product at its UC output, while simultaneously providing the message symbol $u_{i+1}$ and the clock signal $SMC_i$ at its other two outputs.

Cauchy Cell 22

Figure 6B:
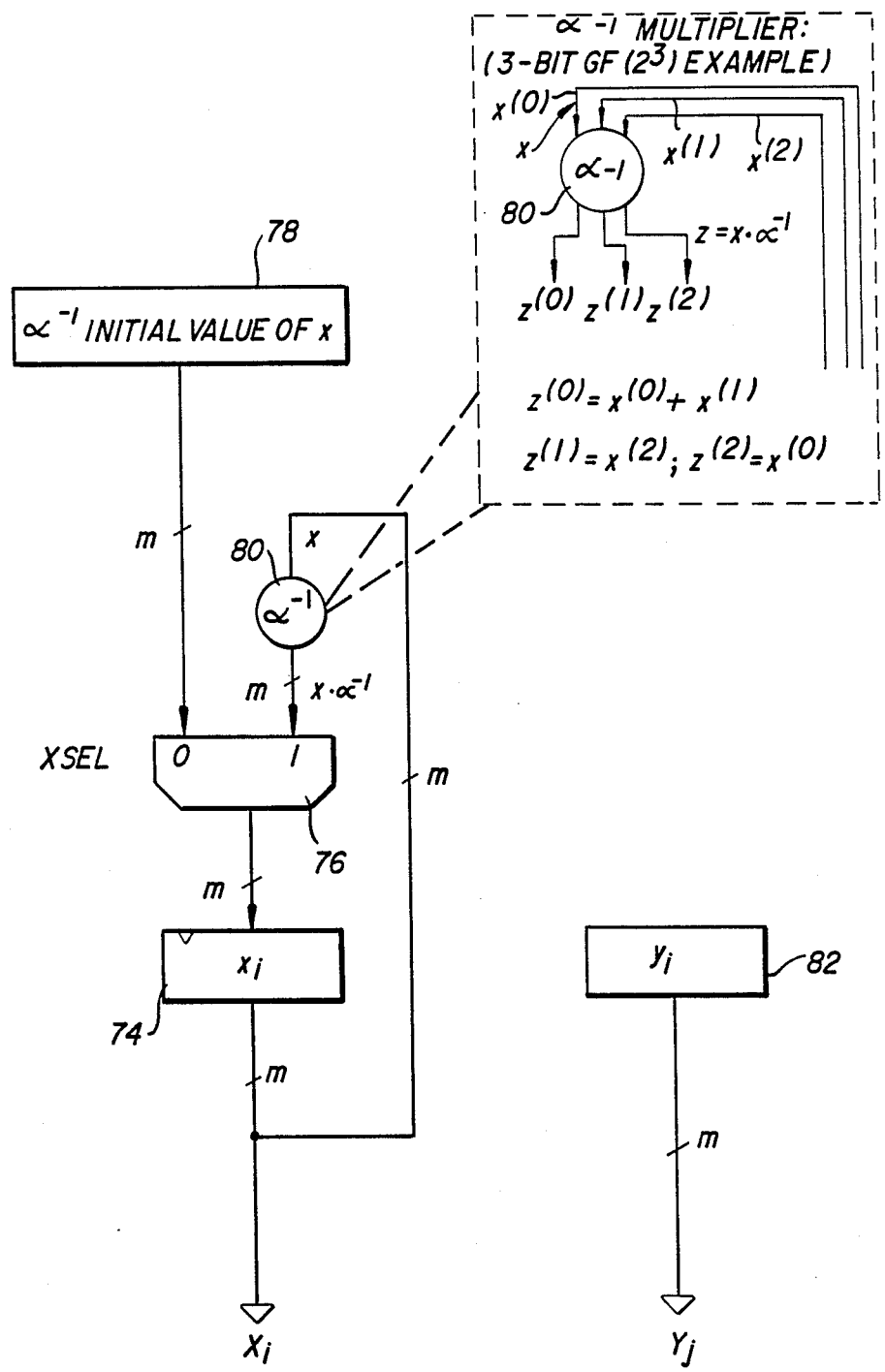
Figure 6C:
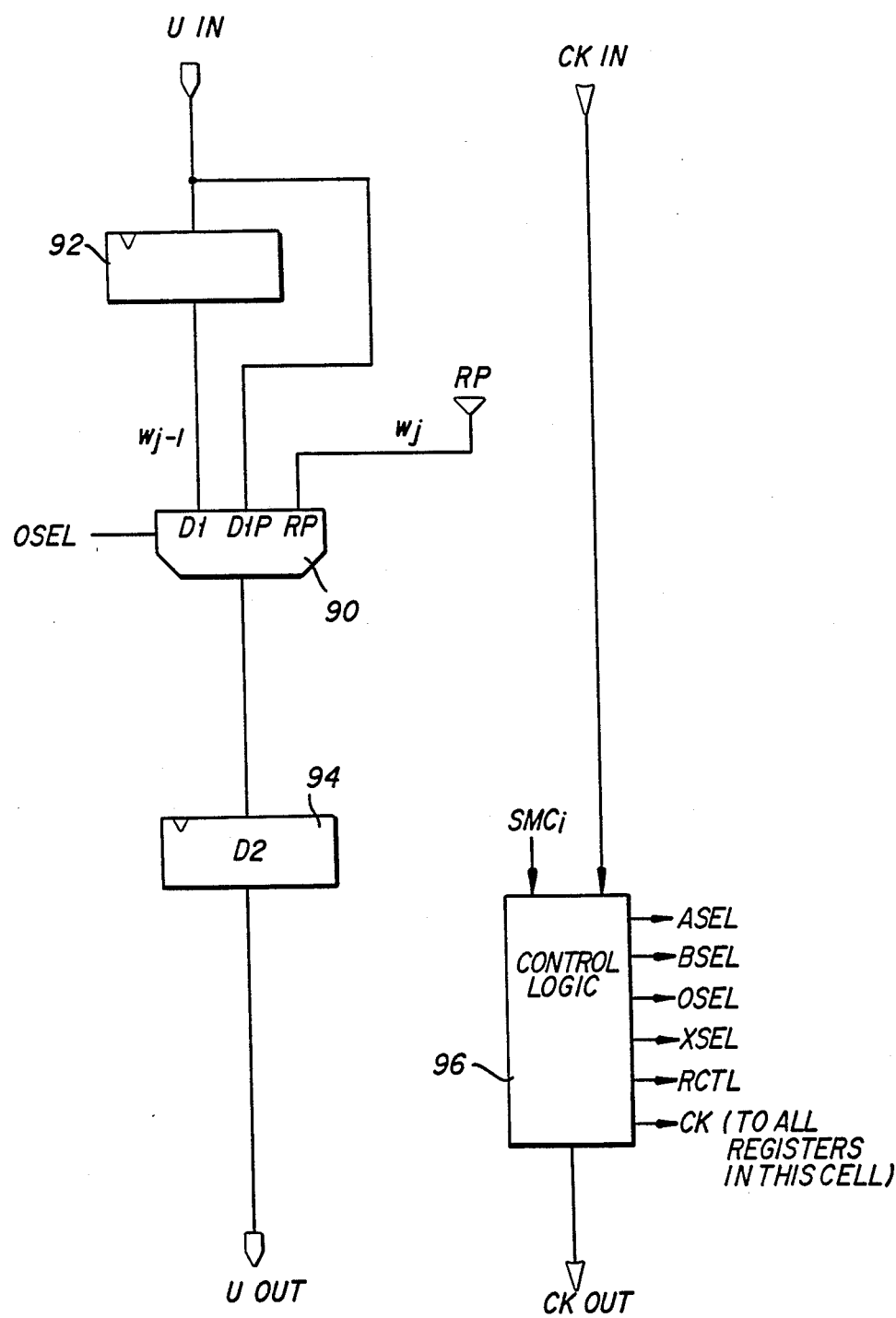

The Cauchy cell 22 of FIG. 3 is illustrated in greater detail in FIGS. 6a–6c. Referring to FIG. 6a, the UC input of the Cauchy cell 22 is applied to the 0 input of a multiplexer 50, whose output is applied to an m-bit A register 52. The output of the A register 52 is applied to one input of a Galois field multiplier 54. Parameters $x_i$ and $y_j$ (whose derivation is illustrated in FIG. 6b) are added together in an adder, namely an m-bit exclusive OR gate 56, whose output is applied to an inverting device 58 which forms the Galois field reciprocal of its input and applies this result to the 0 input of a multiplexer 60. (More complex Galois field inverters are disclosed in Berlekamp, *Algebraic Coding Theory*, Academic Press, 1968, pp. 36–44.)

The 1 input of the multiplexer 60 receives the constant $d_j$ from a D register 62 whose contents is programmed in accordance with equation 5 (where j is the number of the Cauchy cell 22 in the systolic array of FIG. 2). The value of $d_j$ is loaded into the D register 62 during system initialization and remains constant during operation. The output of the multiplexer 60 is applied to a B register 64, whose output, in turn, is applied to the other input of the Galois field multiplier 54. The output of the multiplier 54 is applied to one input of a Galois field adder 66 whose output is stored in an accumulator register 68. The output of the accumulator register 68 is recirculated through an AND gate 70 to the other input of the adder 66. Whenever the RCTL signal (FIG. 7f) is zero, the AND gate 70 causes the content of the accumulator register 68 to be reset to zero in preparation for the next block of K message symbols.

Overall Cell Operation (FIG. 6a)

As shown in FIG. 6a, the quantity $1/(x_i+y_j)$ is present at the 0 input of the multiplexer 60, the quantity $d_j$ is present at the 1 input of the multiplexer 60 and the quantity $u_i c_i$ is present at the 0 input of the multiplexer 50. Here, it should be noted that the first cycle of the clock signal is the one in which $u_i$ is received at the U input. Thus, "the $i^{th}$ cycle" is well defined. The cycle repeats itself for every codeword. During the $i^{th}$ cycle of the clock signal, the product $u_i c_i$ is received at the UC input of the Cauchy cell 22. (This is only true until i exceeds K, after which no more message symbols $u_i$ are received.) Simultaneously, the ASEL and BSEL control signals (FIG. 7c) are low, causing the $u_i c_i$ and $1/(x_i+y_j)$ quantities to be multiplied together in the multiplier 54. The resulting product is added to the accumulated sum of previous such multiplications by the adder 66, the final accumulated sum being stored in the accumulator register 68. Thus, at the end of K cycles of the clock signal, the quantity $$\sum_{i=1}^{K} \frac{u_i c_i}{x_i + y_j}, 1 \leq j \leq R$$

is stored in the accumulator register 68. This quantity must be multiplied by $d_j$ in order to obtain the $w_j$ of equation (1).

At this point, the ASEL and BSEL control signals (FIG. 7c) become logic ones so that the quantity $d_j$ is applied by the multiplexer 60 to one input of the multiplier 54 while the accumulated sum present at the input of the accumulator 68 is applied by the multiplexer 50 to the other input of the multiplier 54 in order to perform the requisite multiplication by $d_j$. After one more clock cycle, the computation of $w_j$ is complete.

After that, the control signal RCTL (FIG. 7f) controlling the AND gate 70 becomes a logic 0 so that the AND gate 70 applies a zero to one input of the adder 66. Then, $w_j$ (now present at the output of the multiplier 54) is added to zero by the adder 70 and applied to an RP output 72 of the Cauchy cell subsystem of FIG. 6a. The RP output 72 is connected to the sub-system of FIG. 6c, discussed below.

Origin of $x_i$ and $y_j$ (FIG. 6b)

Referring to the subsystem of FIG. 6b, the $x_i$ input to the subsystem of FIG. 6a is furnished from an X register 74 whose contents is determined for each value of i (number of clock cycles) in accordance with equation (2). For this purpose, a multiplexer 76 receives the initial value $x_1$ at its 0 input from a register 78 storing a $x_1$. $x_1$ is the reciprocal of $\alpha$, namely $\alpha^{-1}$. (As mentioned earlier, $\alpha$ is simply a primitive element of the Galois field GF($2^m$). The value of $\alpha^{-1}$ is loaded into the register 78 during system initialization and remains constant during operation.

The output of the X register 74 is recirculated to a constant multiplier 80 which multiplies the X register output by $\alpha^{-1}$ and furnishes the resulting product to the 1 input of the multiplexer 76.

In operation, the XSEL control signal (FIG. 7e) is in the 0 state just before the arrival at cell j of the stream of K message symbols $u_i$. At this point, the initial value $x_1$, namely $\alpha^{-1}$, is loaded through the multiplexer 76 into the X register 74. Then, the XSEL signal enters the 1 state and, in synchronism with the clock signal CK, the contents of the X register 74 is recirculated so as to be repeatedly multiplied by $\alpha^{-1}$, so that it becomes $\alpha^{-2}, \alpha^{-3} \ldots \alpha^{-i}$ (during the $i^{th}$ cycle of the clock signal) ... etc ... During the $i^{th}$ cycle of the clock signal, $x_i$ is present at the output of the register 74 and is applied to the $x_i$ input of the adder 56 (FIG. 6a).

One implementation of the constant multiplier 80 is shown in exploded view in FIG. 6b, for the three-bit example of GF($2^3$). In this example, all symbols are 3-bit binary numbers and the constant multiplier 80 performs a linear transformation on each 3-bit byte applied at its X input to produce a 3-bit product byte at its Z output equal to X multiplied by $\alpha^{-1}$. The linear transformation is indicated in FIG. 6b, and need not be elaborated here.

The $y_j$ input to the adder 56 of FIG. 6a is simply taken from a $y_j$ register 82 whose contents is predetermined in accordance with equation (3), where j equals the number of the particular cell 22 in the systolic array of FIG. 2. The value of $y_j$ is loaded into the register 82 during system initialization and remains constant during system operation.

Insertion of the Check Character $w_j$ Behind the Stream of Message Characters $u_i$ (FIG. 6c)

The $j^{th}$ Cauchy cell 22 (FIG. 2) is responsible for inserting the computed check symbol $w_j$ following the message stream emanating from the upstream neighboring cell (the $j-1^{st}$ cell). FIG. 6c illustrates the U input of the $j^{th}$ cell 22 and the U output of the same cell through which the message stream flows and where the check symbol $w_j$ must be inserted at the proper moment. A three-input multiplexer 90 receives the message stream at its D1 input through an m-bit delay stage 92 (having a delay of one clock cycle) and at its D1P input (with no delay). The RP input of the multiplexer 90 is connected to the RP output 72 of the subsystem of FIG. 6a to receive the check symbol $w_j$ (to facilitate the injection of $w_j$ following the message stream at the proper moment). The multiplexer 90 is controlled by a three-state logic signal OSEL (FIG. 7d). The output of the multiplexer 90 passes through another m-bit delay stage 94 before reaching the U output of the cell 22.

Referring to FIG. 7d, during the reception of the stream of K message symbols $u_i$, the OSEL signal is in its D1P state, so that the multiplexer 90 receives, without any delay, each of the $u_i$ message symbols from the U input and sends them directly through the delay 94 to the U output. In this state, the cell is transparent to (does not delay) the message/check symbol stream. Then, (in one embodiment of the present invention) following the conclusion of the message stream (after the last message symbol $u_k$ has been received), the OSEL signal changes to its RP state. This causes the check byte $w_j$ present at the RP output 72 of the $j^{th}$ cell 22 (subsystem of FIG. 6a) to be loaded through the RP input of the multiplexer 90 and sent through the delay 94 to the U output of the cell 22 (subsystem of FIG. 6c). In the meantime, the check symbol $w_{j-1}$ (and its predecessors), which had (up to this point) immediately followed the last message symbol $u_k$, is being held (for one clock cycle) in the delay stage 92. At the end of this cycle, the OSEL signal leaves its RP state and enters its D1 state. Thus, the check symbol $w_{j-1}$ held in the delay stage 92 (and all subsequent check symbols) is now transmitted by the multiplexer 90 from its D1 input through the delay stage 94 to the U output immediately following the last check symbol $w_j$ previously furnished through the RP input of the multiplexer 90. Thus, the subsystem of FIG. 6c, in effect, creates a gap between the incoming message stream and the trailing stream of check symbols and inserts the check symbol computed in the present cell into the gap.

Varying Redundancy During Operation

If the number K of redundant characters is to be reduced to R-1, then the last cell (cell R) in the array of FIG. 2 is "disabled" by preventing its OSEL signal from ever leaving the D1P ("transparent") state. More cells may be so disabled for further reductions in R. To increase R, selected ones of the disabled cells may be enabled, or desired.

Reversing the Order of the Redundant Symbols

In an alternative embodiment, the check symbol $w_j$ is inserted at the end of the check byte stream (i.e. after $w_{j+1}$) (rather than being inserted between the message stream and the trailing check byte stream), so as to insert the R check symbols $w_j$ into the stream in the opposite order from that described above. This feature requires more complex control.

Choice of Code

In an alternative embodiment, $c_i$ and $d_j$ may be set to 1 for each $1 \leq i \leq K$, $1 \leq j \leq R$ (thus, in effect, dispensing with the multiplications by these parameters). Actually, this significantly simplifies the system: it eliminates the $u_i c_i$ processor altogether, as well as the need for separate $u_i$ and $u_i c_i$ inputs/outputs. In this alternative embodiment, the encoder would append to the message stream R check symbols computed (as a result of this modification) in accordance with a "generalized Reed-Solomon Code" of the type described, for example, in the above-referenced publication by Seroussi and Roth.

Generation of the Control Logic Signals

The control signals ASEL, BSEL, OSEL, XSEL and RCTL discussed previously in connection with FIGS. 6a, b and c and FIGS. 7a, b, c, d, e and f are generated in synchronism with the clock signal CK within each cell by the control logic circuit 96 which receives the $SMC_i$ and CK signals from the SMC and CK_IN inputs of the cell 22. The control logic circuit distributes a version of the clock signal CK to all of the registers in the cell 22. A skilled worker may readily implement the control logic circuit 96 as a programmable logic array (or the like) in accordance with FIGS. 7a-7f.

Systolic Clock signal

FIG. 6c illustrates the "CK—IN" clock input to the cell, receiving the clock signal CK from the neighboring upstream cell. The control logic circuit 96 receives the clock signal CK from the CK—IN input and passes it on to the clock output CK—OUT output of the cell to the neighboring downstream cell. Cell operation timing, controlled by the logic circuit 96, is therefore synchronous only between adjacent cells, and is otherwise asynchronous. The advantage is that the longest clock delay is the short distance between adjacent cells, and the system may therefore operate at very fast clock rates.

While the invention has been described in detail with specific reference to preferred embodiments thereof, it is understood that variations and modifications thereof may be made without departing from the spirit and scope of the invention.

What is claimed is:

1. A systolic encoder for encoding a stream of message symbols, said encoder comprising:
a plurality of Cauchy cells;
means connecting said Cauchy cells in series whereby said stream of message symbols may flow through said series of cells so that each cell receives a current message symbol from its upstream neighbor cell while transmitting the previous message symbol to its downstream neighbor cell;
wherein each of said cells comprises:
(1) means for performing at least a portion of a Galois field arithmetic computation of a corresponding redundant check symbol in accordance with a code generator polynomial from said stream of message symbols, independently of the arithmetic operations performed in others of said Cauchy cells, and
(2) means for appending said corresponding redundant check symbol to the end of said stream of message symbols, whereby said stream of message symbols merges from said series of Cauchy cells having a serial stream of R redundant check symbols appended to it thereby forming a stream of message symbols and redundant check symbols.

2. The systolic encoder of claim 1 wherein said means for appending may be selectively enabled or disabled so as to render a particular cell neutral, whereby to increase or reduce the number of redundant check symbols appended to said stream of message symbols.

3. The systolic encoder of claim 1 further comprising a common processor adapted to perform the remaining portion of said Galois Field computation once to generate a partial result, whereby said partial result is made available successively to each of said cells.

4. The encoder of claim 3 wherein said common processor comprises:
means for storing a first constant $c_1$;
means for supplying a recursion ratio $c_{i+1}/c_i$ for each index i;
means for multiplying a given constant $c_i$ by said ratio to determine the next constant $c_{i+1}$; and
means for computing the product between each message symbol $u_i$ and a corresponding constant $c_i$.

5. The encoder of claim 1 wherein said encoder is adapted to process a stream of K message symbols $u_i$, where index i in $u_i$ runs from 1 through K, wherein each of said cells computes an individual one of the R redundant symbols, wherein the $j^{th}$ one of said cells computes the redundant symbol $w_j$, and wherein each of said cells includes means for creating a space in said stream of message symbols and redundant check symbols appended by neighboring cells upstream of said $j^{th}$ cell, wherein said $j^{th}$ cell may insert said redundant symbol $w_j$ into said space.

6. The encoder of claim 5 wherein said means for creating said space in said stream of message symbols and redundant check symbols comprises:
a multiplexer having three inputs;
means for applying said stream of message symbols through a delay stage to a first one of said multiplexer inputs;
means for applying said stream of message symbols to the second one of said multiplexer inputs;
means for applying the check symbol $w_j$ computed within a corresponding cell to the third one of said multiplexer inputs; and
control signal means for causing said multiplexer to select said first input during reception of the first K symbols from the upstream neighboring cell, for selecting said third input immediately following reception of the $K^{th}$ one of said symbols from said neighboring upstream cell and for selecting said second multiplexer input immediately thereafter.

7. The encoder of claim 1 wherein said means for performing at least a portion of said Galois field arithmetic operation comprise:
means for computing a Galois field reciprocal of the sum of $x_i + y_j$, where $x_i$ corresponds to a given value of said index i and $y_j$ is constant within the $j^{th}$ cell for all values of said index i;
means for multiplying said reciprocal by the product of each message symbol $u_i$ and a constant $c_i$ corresponding to a given value of said index i, and accumulating the resulting product with all products of previous such multiplication operations for successive values of said index i, so as to produce a sum; and
means for multiplying said sum by a constant $d_j$ characteristic of said $j^{th}$ cell and constant over all values of said index i.

8. The encoder of claim 1 wherein said means for computing said Galois field reciprocal comprise:
means for furnishing the value of $y_j$ for inclusion in said sum $x_i + y_j$, wherein said $y_j$ value is $\alpha^{(-K+j)}$ where $\alpha$ is a primitive element of a Galois field, K is the number of said message symbols in said stream and j is the number of the particular cell in said plurality of successive cells.

9. The encoder of claim 7 further comprising means for generating $x_i$, said generating means comprising means for multiplying a Galois Field symbol $\alpha^{-1}$ by itself for a number of times equal to the value of said index i.

10. The encoder of claim 9 wherein said means for multiplying $\alpha^{-1}$ by itself comprises an accumulator register and means connected between the input and the output of said accumulator register for performing a linear bit transformation among the bits at the output of said accumulator register, said transformation corresponding to a multiplication of said accumulator register output bits by the Galois field element $\alpha^{-1}$.

11. The encoder of claim 1 wherein timing in each of the cells is controlled by a clock signal which is passed systolically from cell to cell, so that adjacent cells operate synchronously and the successive cells as a whole operate asynchronously.

12. A method for systematically systolically encoding a stream of message symbols in accordance with a Reed-Solomon code generator polynominal of redundancy R, said method comprising:

computing in each of a plurality of a systolic array of cells a Galois field reciprocal of the sum of a constant $x_i$ corresponding to a given value of index i in $x_i$ and a number of $y_j$ which is constant in the $j^{th}$ one of said cells for all values of said index i;

multiplying said reciprocal by the product of each message symbol $u_i$ in said message stream and a constant $c_i$ corresponding to a given value of said index i, and accumulating the resulting product with all products of previous such multiplications for successive values of i, to produce a product sum; and multiplying said product sum by a constant $d_j$ characteristic of the $j^{th}$ one of said cells and constant over all values of said index i.

13. The method of claim 12 further comprising a process for computing said product of $u_i$ and $c_i$, said process comprising:

storing a fixed constant $c_i$;

storing a recursion ratio $c_{i+1}/c_i$ for each value of said index i;

multiplying a given constant $c_i$ by said ratio to determine the next constant $c_{i+1}$; and multiplying each $c_i$ with each of said message symbols $u_i$ for each value of said index i.

14. The method of claim 12 further comprising a process for generating said constant $x_i$, said process comprising:

storing an initial value of $x_i$ equal to $\alpha^{-1}$;

multiplying said initial value $\alpha^{-1}$ by $\alpha^{-1}$ repeatedly for a number of repetitions equal to the value of said index i.

15. The method of claim 14 wherein said step for multiplying said symbol $\alpha^{-1}$ by itself comprises:

for each value of said index i, storing the results of the previous such multiplication of $\alpha^{-1}$ by itself; and transforming the individual bits of said result in accordance with a linear transformation corresponding to multiplication of that result by $\alpha^{-1}$.

16. The method of claim 12 further comprising controlling the timing of each of the foregoing steps in each of said cells in accordance with a clock signal, and systolically passing said clock signal from cell to cell.

* * * * *